United States Patent
Carr et al.

(10) Patent No.: US 8,018,753 B2
(45) Date of Patent: Sep. 13, 2011

(54) MEMORY MODULE INCLUDING VOLTAGE SENSE MONITORING INTERFACE

(75) Inventors: Dennis Carr, Roseville, CA (US); Michael Bozich Calhoun, Roseville, CA (US); Teddy Lee, Roseville, CA (US); Lidia Warnes, Roseville, CA (US); Dan Vu, Elk Grove, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 321 days.

(21) Appl. No.: 12/262,038

(22) Filed: Oct. 30, 2008

(65) Prior Publication Data

US 2010/0115179 A1    May 6, 2010

(51) Int. Cl.
*G11C 5/06* (2006.01)
(52) U.S. Cl. .......................................... 365/63; 365/226
(58) Field of Classification Search .................. 365/63, 365/226
See application file for complete search history.

(56) References Cited

U.S. PATENT DOCUMENTS

| | | | |
|---|---|---|---|
| 6,594,556 | B1 | 7/2003 | Agatstein et al. |
| 7,007,184 | B2 | 2/2006 | Sabotta et al. |
| 2003/0206046 | A1 | 11/2003 | To et al. |
| 2004/0190334 | A1 | 9/2004 | Baker |
| 2004/0268161 | A1 | 12/2004 | Ross |
| 2005/0018477 | A1 | 1/2005 | Baker |
| 2006/0248413 | A1* | 11/2006 | Versen et al. .............. 714/718 |
| 2006/0294437 | A1 | 12/2006 | Washburn et al. |
| 2007/0195613 | A1* | 8/2007 | Rajan et al. .............. 365/189.05 |
| 2010/0003837 | A1* | 1/2010 | Loughner et al. .............. 439/64 |

* cited by examiner

*Primary Examiner* — Hoai V Ho

(57) ABSTRACT

Memory devices and systems include a voltage sense line for addressing voltage tolerances across variable loadings. The memory devices and systems comprise a memory module connector with a first plurality of pins coupled to circuitry on a memory module, and a second plurality of pins coupled to power rails on the memory module that enable monitoring of the power rails from external to the memory module.

5 Claims, 12 Drawing Sheets

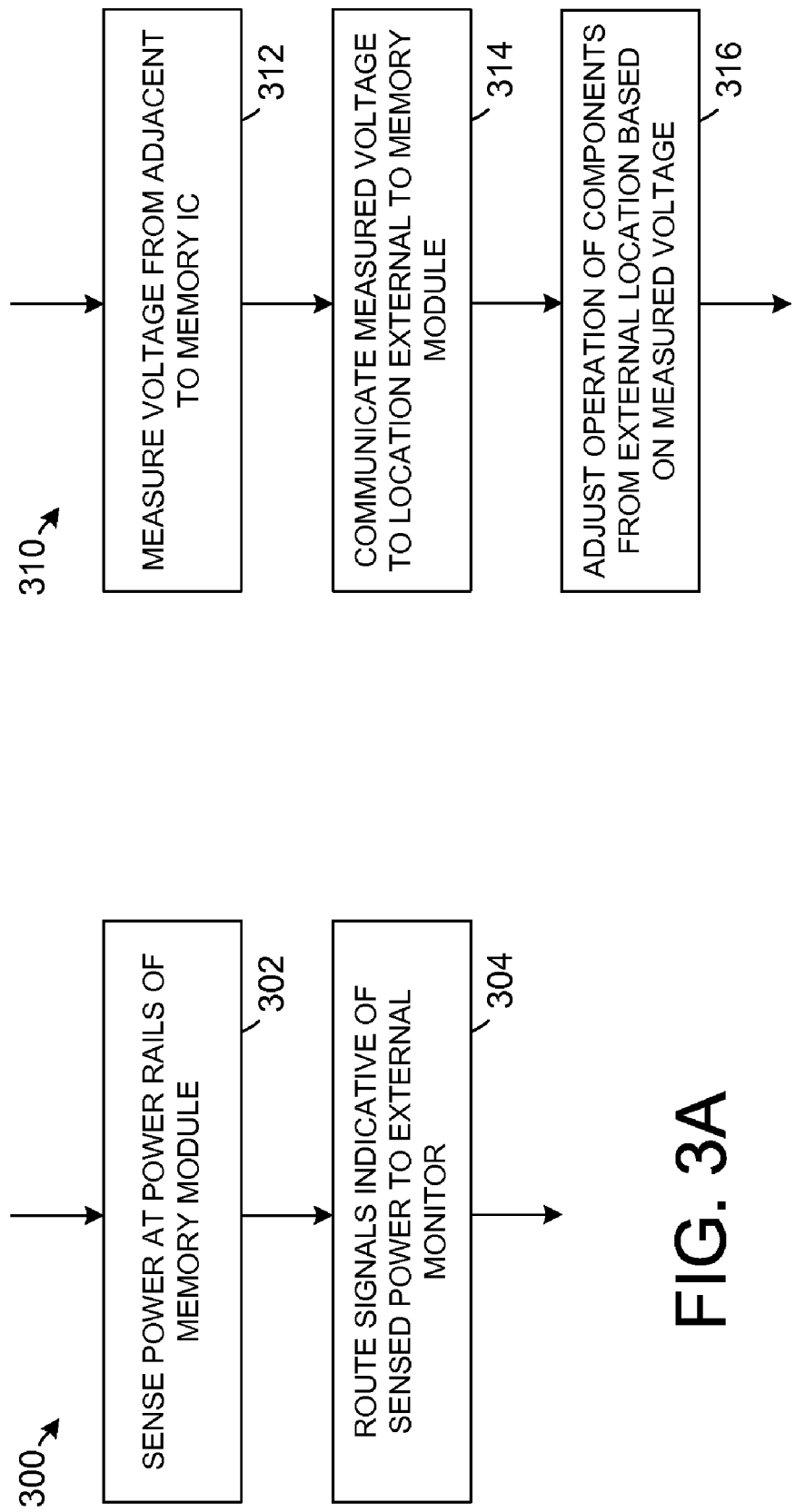

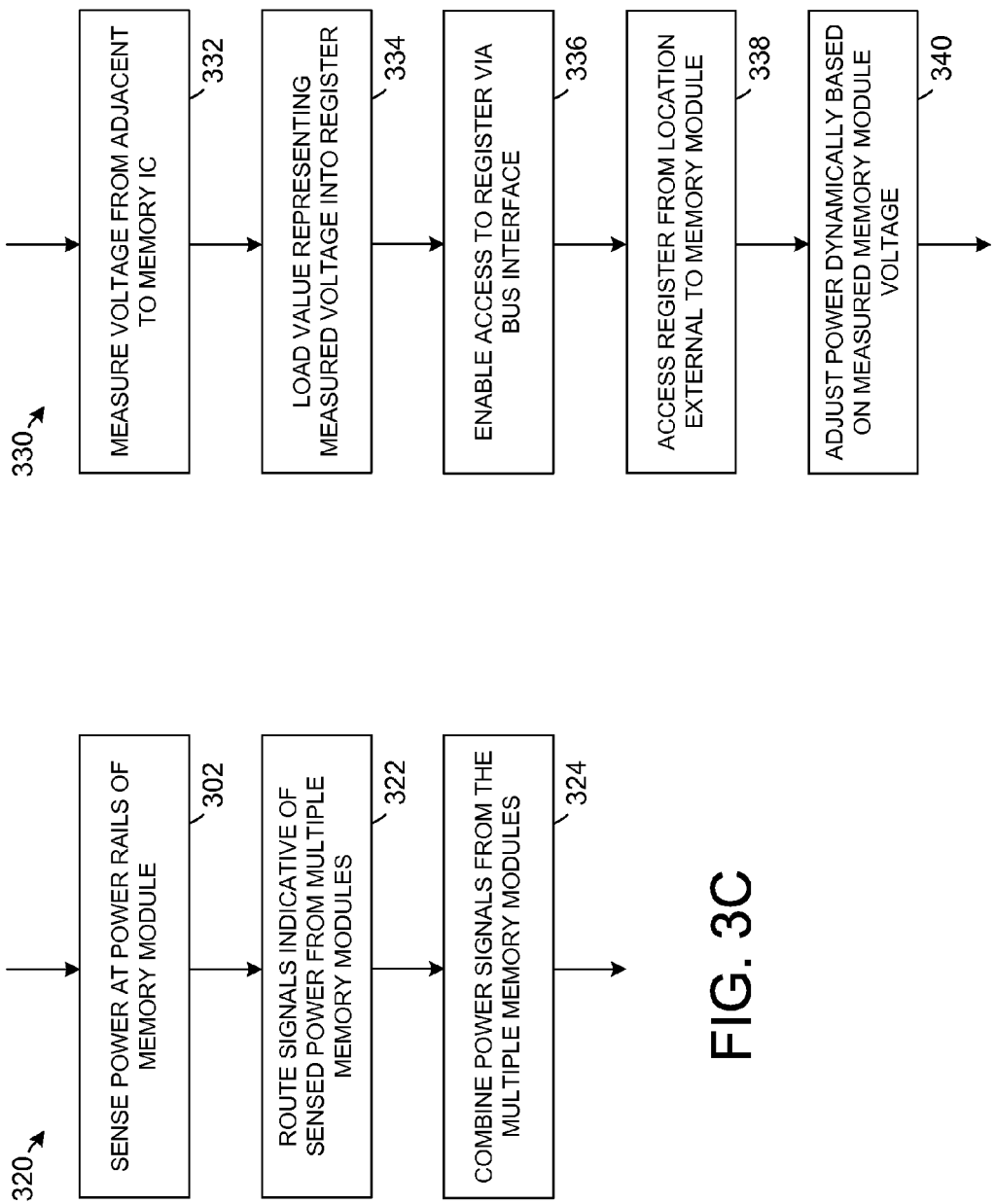

MEMORY MODULE INCLUDING VOLTAGE SENSE MONITORING INTERFACE

BACKGROUND

Computers, servers, communication devices, workstations, and the like store data in memory modules that typically receive pre-regulated electrical power from the motherboard through a single module interface connector. Multiple regulated bias voltages are usually supplied and can include, for example, a dynamic random access memory (DRAM) memory integrated circuit (IC) positive power supply voltage ($V_{DD}$), a DRAM input/output (I/O) driver positive power supply voltage ($V_{DDQ}$), and a DRAM I/O reference supply voltage ($V_{REF}$). $V_{REF}$ is usually low current and supplied over a single input pin. $V_{DD}$ and $V_{DDQ}$ and respective return lines ($V_{SS}$ and $V_{SSQ}$) are applied through multiple pins that are distributed along the module interface connector.

Memory module power systems have difficulty maintaining constant reference voltages for several reasons. For example, the remote location of regulator output from memory device integrated circuits on memory modules limits regulator transient load response time. The large output capacitance that is used to address the wide range of the regulator output current supply additionally limits transient response time. Furthermore, system board switching regulation produces high frequency switching noise that is imposed on memory module bias voltages, alters memory module timing, and limits actual memory operating speed.

To attain higher speed memory module performance, even for large memories, significant limiting factors, including factors associated with memory system power generation, regulation, and distribution are to be addressed.

As memory technology advances and voltages are reduced to improve power consumption, tolerances for voltage also decrease. Maintaining specified voltage levels on memory modules (such as dual in-line memory modules (DIMMs)) across memory subsystems becomes much more difficult. Maintaining the specified voltage levels is particularly difficult across multiple memory configurations with different power specifications, therefore causing power drops across the power plane.

SUMMARY

Embodiments of memory devices and systems include a voltage sense line for addressing voltage tolerances across variable loadings. The memory devices and systems comprise a memory module connector with a first plurality of pins coupled to circuitry on a memory module, and a second plurality of pins coupled to power rails on the memory module that enable monitoring of the power rails from external to the memory module.

BRIEF DESCRIPTION OF THE DRAWINGS

Embodiments of the invention relating to both structure and method of operation may best be understood by referring to the following description and accompanying drawings:

FIGS. 3A through 3D are flow charts illustrating one or more embodiments or aspects of a method for managing power in a computer memory.

DETAILED DESCRIPTION

Various embodiments of memory devices and systems include voltage sense lines added to a memory module pin definition to manage power across variable loadings, enabling improved maintenance of specified voltage at memory devices such as DRAMs.

Memory device and system structures are disclosed herein that enable voltage sensing at the load and can substantially improve the ability to meet tight tolerances across variable loadings by sensing regulated bias voltages directly from the power rail on a memory module near memory integrated circuits. In contrast, conventional systems sense the power rail on the system board, which is inadequate for new technologies such as fully buffered dual in-line memory modules (FBD), double-data-rate-3 (DDR3) DRAM, and possible future technologies. The illustrative memory device and system structures wherein, for example, the dynamic random access memory (DRAM) power rail is sensed on dual in-line memory modules (DIMMs) near the DRAMs enables maintenance of tight voltage requirements.

Figure 1A:
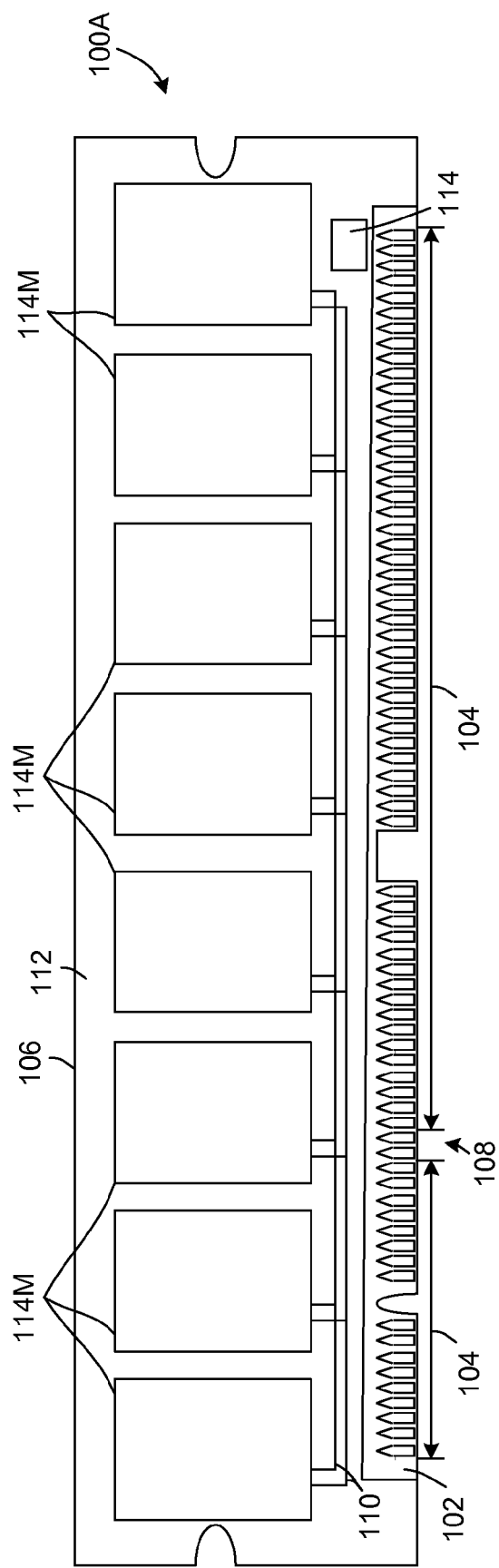
FIGS. 1A through 1F are schematic block and circuit diagrams depicting embodiments of a memory apparatus that include a voltage sense line for addressing voltage tolerances across variable loadings.

Referring to FIG. 1A, a schematic block and circuit diagram depicts an embodiment of a memory apparatus 100A that includes a voltage sense line for addressing voltage tolerances across variable loadings. The memory apparatus 100A comprises a memory module connector 102 with a first plurality of pins 104 coupled to circuitry on a memory module 106, and a second plurality of pins 108 coupled to power rails 110 on the memory module 106 that enable monitoring of the power rails 110 from external to the memory module 106.

The memory module 106 further comprises the memory module connector 102, a circuit board 112 coupled to the memory module connector 102, and a plurality of integrated circuits 114 mounted to the circuit board 112.

The second plurality of pins 108 correspond to voltage sense lines that route signals from the power rails 110 on the memory module 106 for use in power sensing external to the memory module 106.

In an example configuration, the second plurality of pins 108 can route signals from the center of power draw on the memory module 106 for power sensing external to the memory module 106, although sensing from any location on the power rails 100A may be implemented.

Figure 1B:
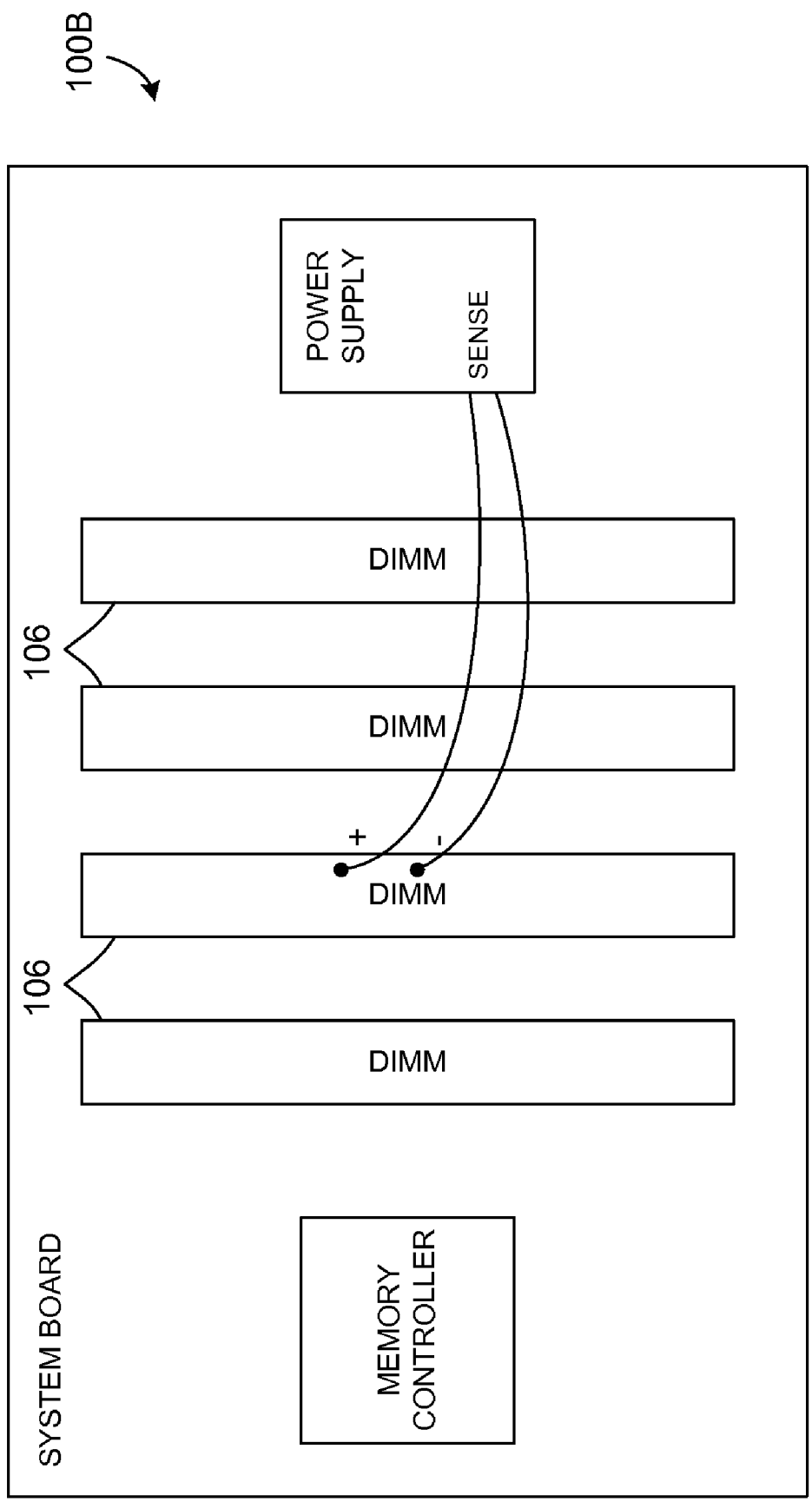

Referring to FIG. 1B in combination with FIG. 1A, a schematic block and circuit diagram depicts another embodiment of a memory apparatus 100B that enables voltage sensing. The memory apparatus 100B can further comprise a plurality of memory modules 106 with one or more of the modules 106. The integrated circuits 114 can include at least one memory integrated circuit 114M.

Figure 1C:
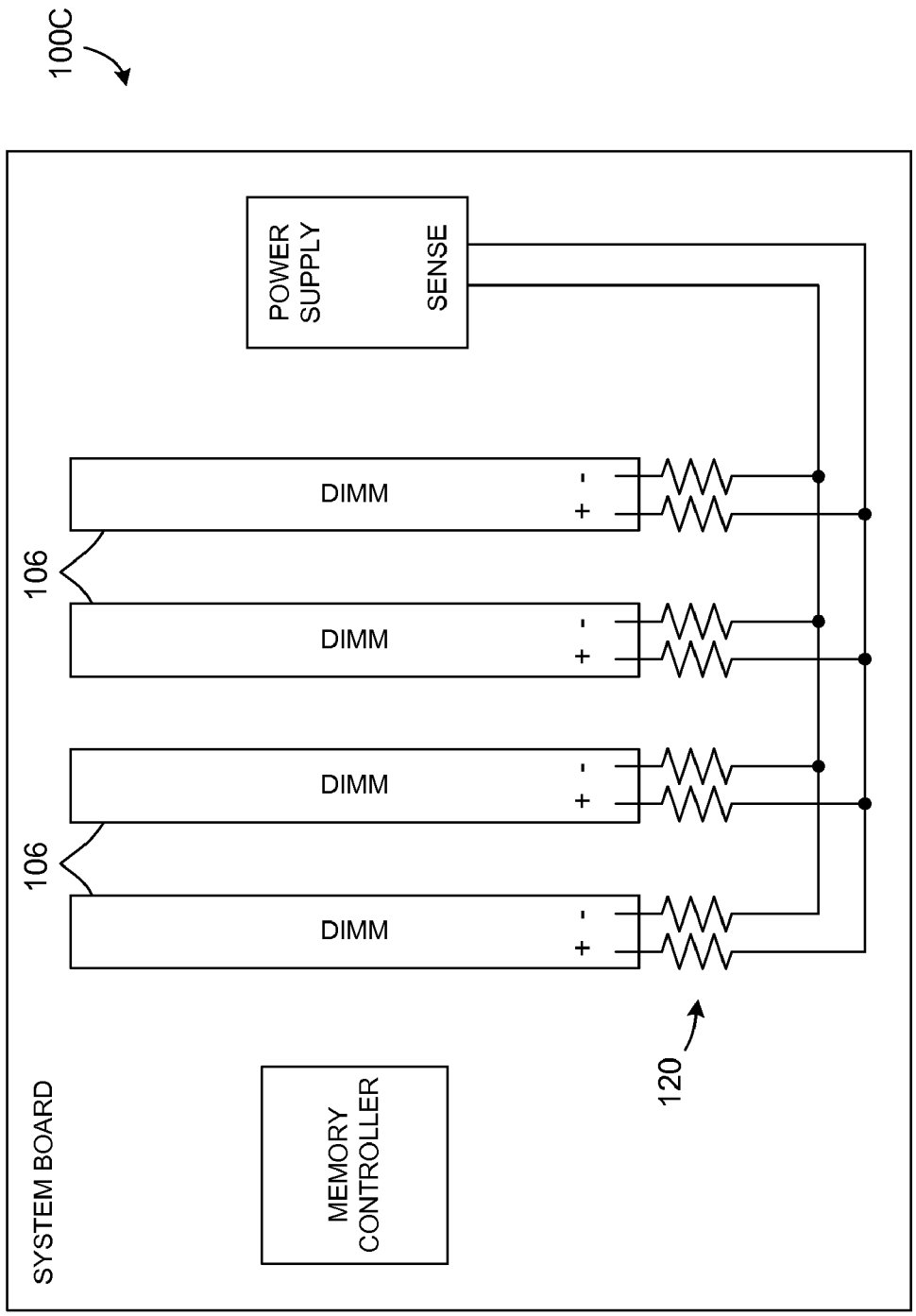

Referring to FIG. 1C in combination with FIG. 1A, a schematic block and circuit diagram depicts another embodiment of a memory apparatus 100C further comprises a circuit 120 that combines power signals from the power rails 110 of the plurality of memory modules 106. In various implementations, the combined signals can be combined in any selected proportions. For example, the signals can be averaged, or combined in a manner resulting in any suitable mathematical combination. If desired, maximum, minimum, mean, geometric mean, or other statistical functions can be implemented.

Figure 1D:
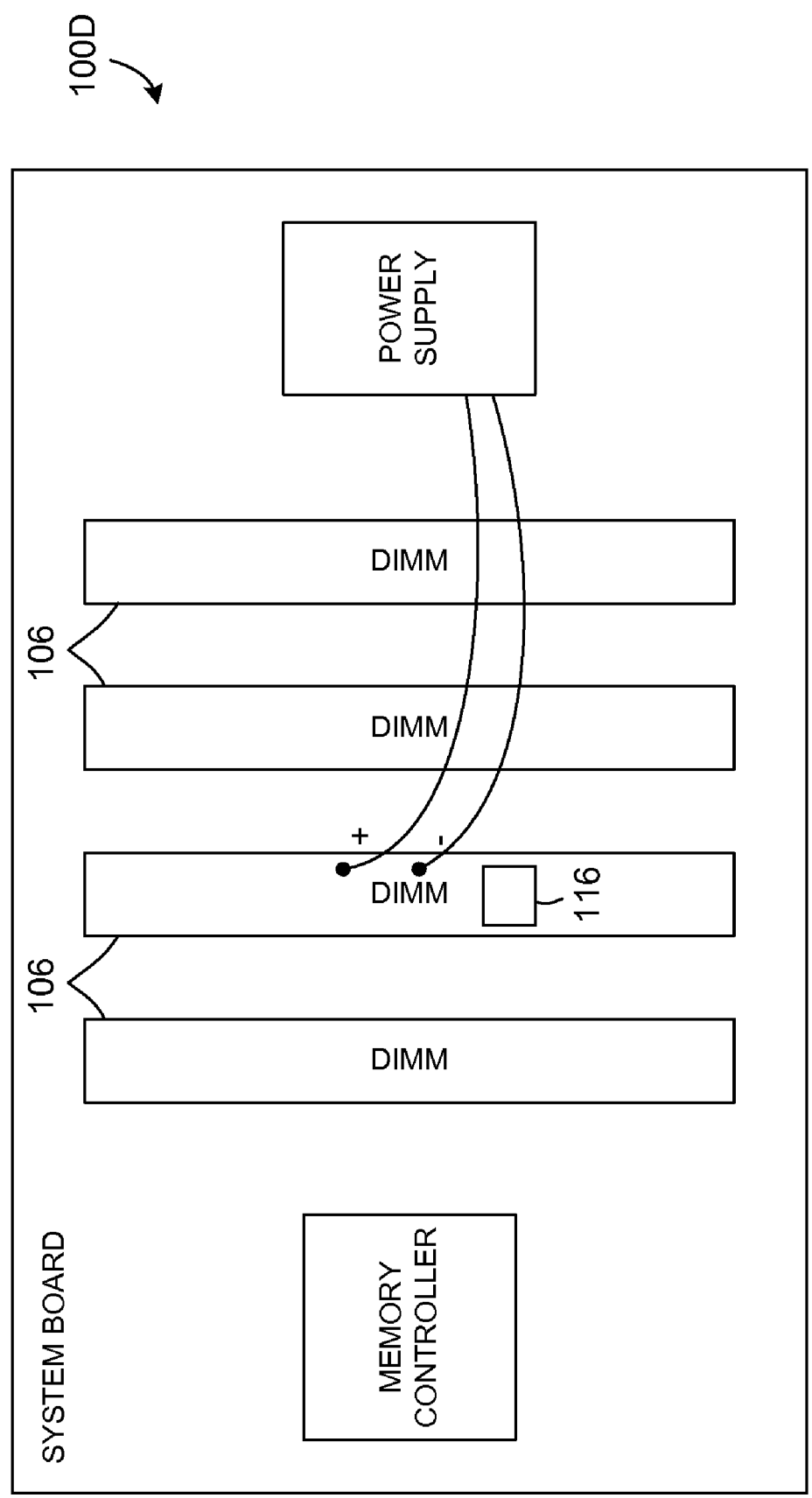
Figure 1E:
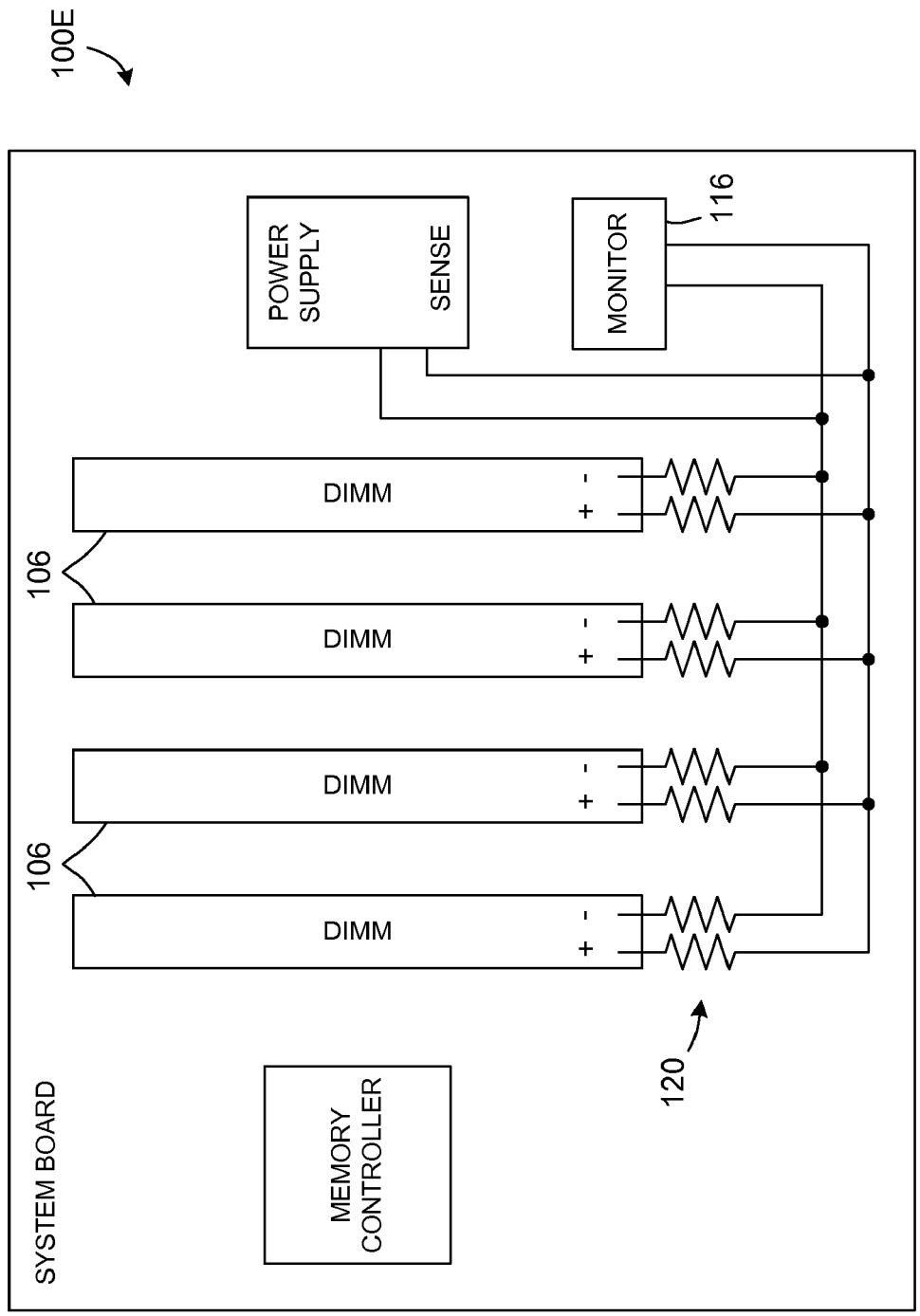

As shown in FIGS. 1D and 1E respective memory apparatus embodiments 100D and 100E can further comprise a circuit 116 that monitors at least one power signal from the power rails 110 of the plurality of memory modules 106. The power signal monitoring circuit 116 can be located on one or more of the memory modules 106 as shown in FIG. 1D, or external to the memory modules as depicted in FIG. 1E.

Figure 1F:
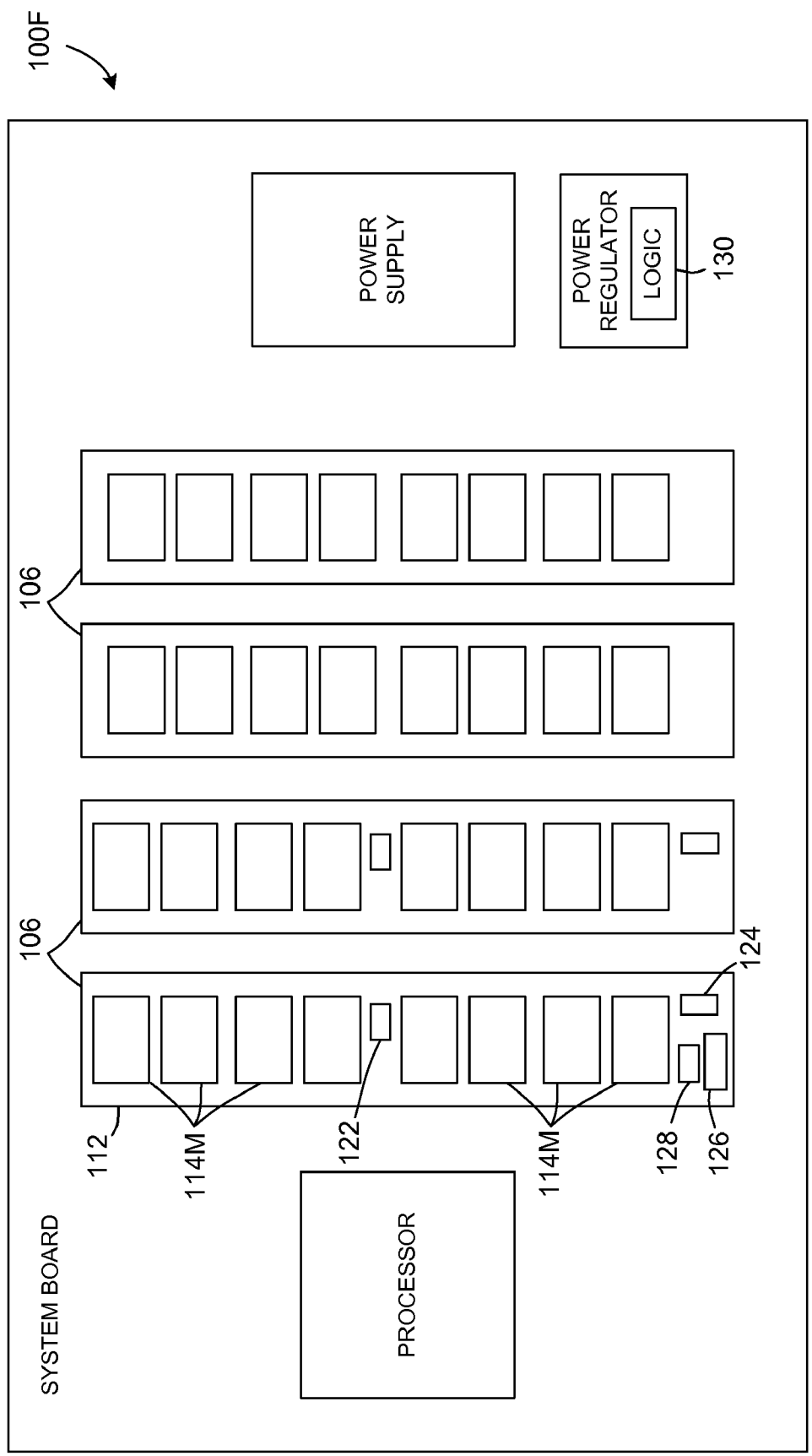

Referring to FIG. 1F, a schematic block and circuit diagram depicts another embodiment of a memory apparatus 100F that enables voltage sensing. The memory apparatus 100F includes one or more memory modules 106. The memory modules 106 comprise the memory module connector 102, a circuit board 112 coupled to the memory module connector 102, and a plurality of memory integrated circuits 114M mounted to the circuit board 112. At least one of the memory modules 106 can further comprise a voltage measurement circuit 122 coupled to the circuit board 112 that measures voltage on the memory module 106, and a register 124 coupled to the voltage measurement circuit 122 that holds a value representing the measured voltage on the memory module 106. A bus interface 126 can be coupled to the register 124 and coupled to the second plurality of pins 108.

In a specific example embodiment, the memory module 106 can be a dual in-line memory module (DIMM) with a plurality of dynamic random access memory (DRAM) integrated circuits mounted on the DIMM. The bus interface 126 can be an inter-integrated circuit ($I^2C$) multi-master serial computer bus or a system management bus (SMBus).

The memory apparatus 100F can further include an electrically-erasable programmable read-only memory (EEPROM) 128 that supports serial presence detect (SPD) wherein SPD memory space is allocated to include the measured memory module voltage.

In some implementations, the memory apparatus 100F can also include logic 130 that reads measured memory module voltage from the serial presence detect (SPD) memory 128 and performs dynamic power system adjustment based on the measured memory module voltage.

The memory apparatus depicted in FIGS. 1A through 1E show examples using either a single DRAM sense line or an averaging approach. FIG. 1F depicts one example of an implementation of a system designer to exploit advantages of the voltage sensing approach. Although the illustrative examples include four DIMMs, the concept applies for any number of DIMMs.

Figure 4:
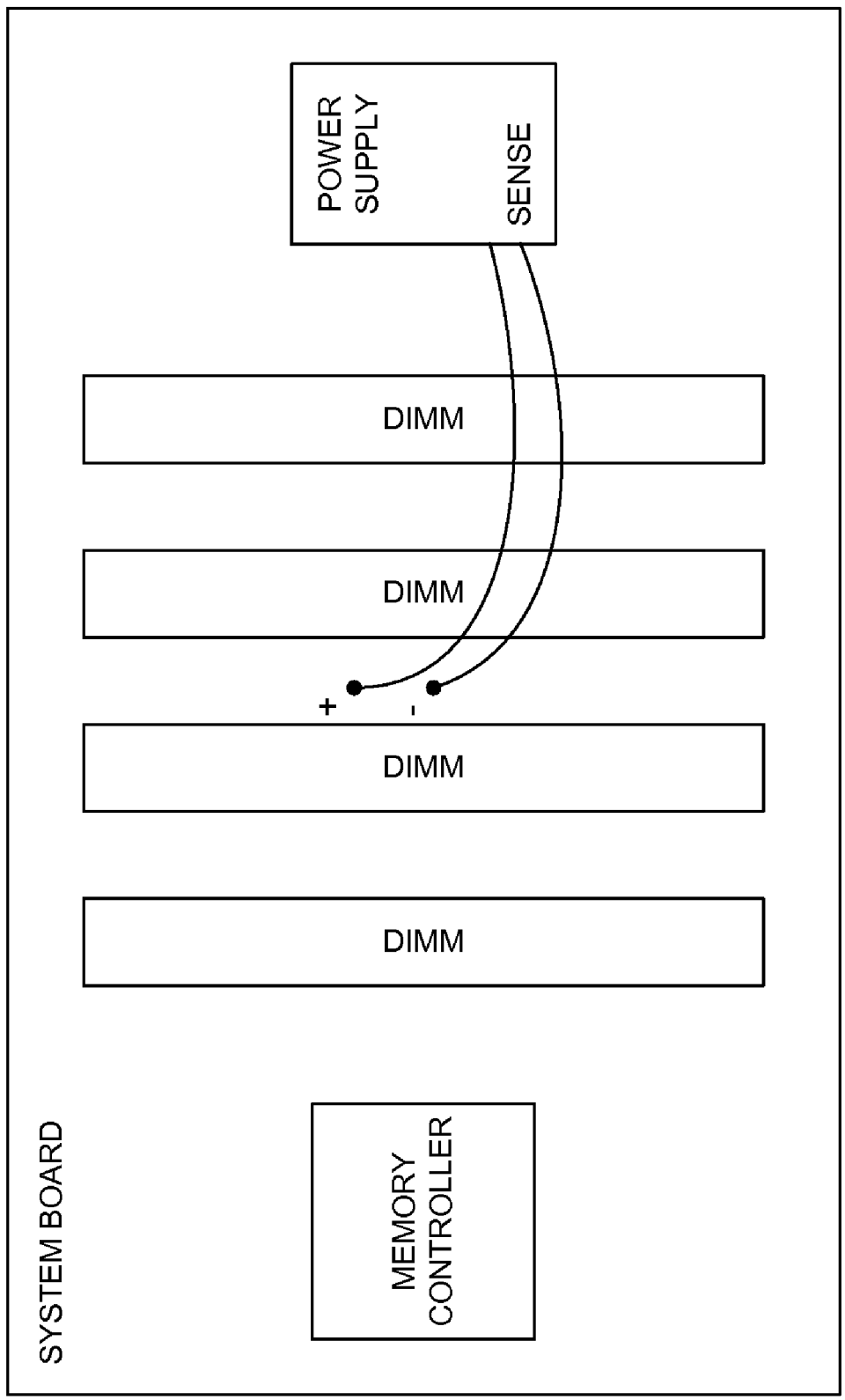
FIG. 4 is a schematic block and circuit diagram that shows a conventional power management approach in which sense lines are typically placed on a system board to enable an average reading of the power plane.

In the memory apparatus embodiments illustrated in FIGS. 1A through 1F, regulated bias voltages are sensed on the memory modules near memory device integrated circuits. In contrast, FIG. 4 shows a conventional approach in which sense lines are typically placed somewhere on the system board or motherboard near the center of the power plane load for the purpose of supplying an average reading of the power plane. The conventional approach centers DRAM voltage on the sense point voltage and is generally adequate but is unfortunately only good for detecting DIMM input voltage. A drawback of the conventional approach is that power drops occur between the sense points and DRAMs that use the rail. DDR3 DIMMs are currently estimated to use as much as 17 W on a 1.5V rail, resulting in a load of 11 A although current draw can be as low as 1 to 2 A when a system is idle between operations. A conservative estimate of impedance for DIMM socket contacts on the power rails is approximately 1.5 mOhms, based on 22 power connectors with 20-30 mOhms per contact and 64 ground pins. Power planes on the DIMM also add about 1.5 to 2 mOhms of resistance. Assuming a total of 3 ohms, the 10 A difference between minimum and maximum loading is approximately 30 mV. For DDR3, the 1.5V rail tolerance is 75 mV so the 30 mV difference is a significant portion of the power rail budget that must be allocated, thereby requiring the power supply to have much tighter regulation and/or an extremely low tolerance voltage set point.

In the memory apparatus embodiments illustrated in FIGS. 1A through 1F, voltage sense lines can be routed from the DIMMs power rails, for example at the center of power draw, to edge pins for use by the system board in power sensing. In an example structure, two pins from the DIMM socket connector can be allocated for the sense lines. A system designer can then route the sense line signals back to the power supply. If multiple DIMMs are installed in the system, the system designer can sense voltage using a single pair of signals from one DIMM or combine the signals for an averaging effect. Although the averaging effect may appear to attain a similar result to the conventional system (depicted in FIG. 4) that senses from the system board, the combining or averaging technique has the advantage of actually averaging the voltages at the DRAMs rather than at the sockets and thus takes into account the voltage drops of the socket and DRAM power planes.

The memory apparatus embodiments illustrated in FIGS. 1A through 1F enable the voltage to be sensed on the DIMM at the DRAMs, eliminating variability in loss across the DIMM sockets and DIMM power planes that result from using DIMMs with various DRAM quantities and due to variations in power draw over time. Thus the portion of power budget tolerance consumed by the loss is reduced, allowing more flexibility in the remainder of the design, potentially saving cost by enabling a looser tolerance for the power supply.

Figure 2A:
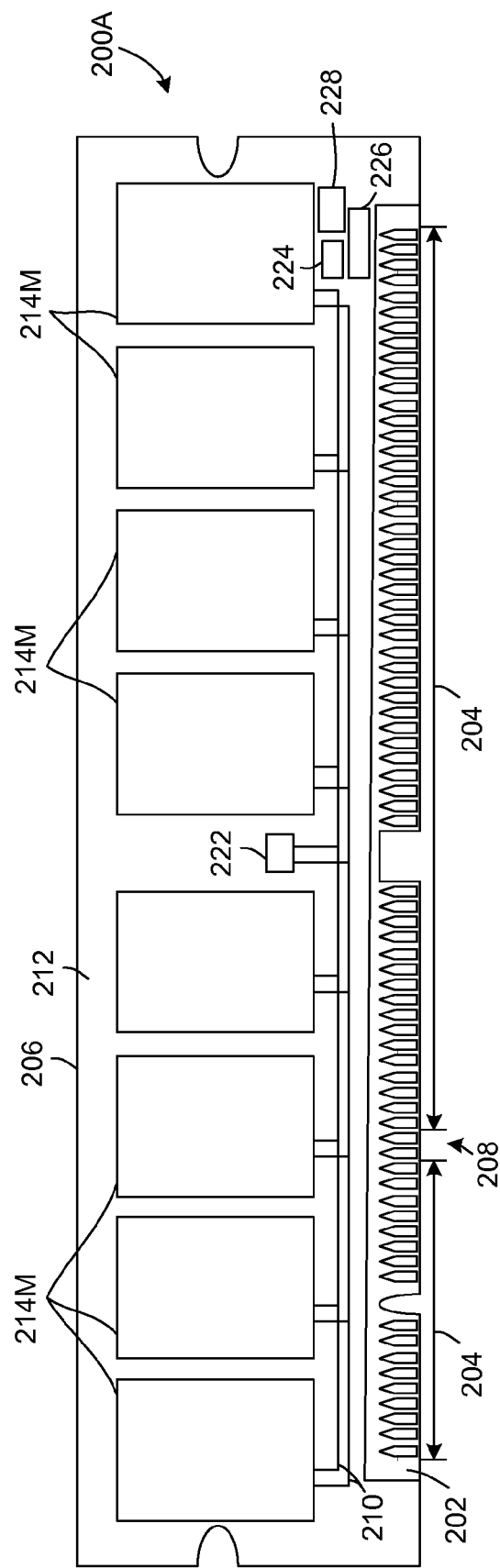
FIGS. 2A, 2B, and 2C are schematic block and circuit diagrams showing an embodiment of a system that uses on-die termination for memory signal lines.

Referring to FIG. 2A, a schematic block and circuit diagram depicts an embodiment of a memory apparatus 200A that measures sense voltage at a position nearby to a memory integrated circuit. The memory apparatus 200A is configured with a voltage sense architecture in a memory module such as a DIMM that enables sensing of voltage at the load which can substantially improve the capability to meet tight tolerances across variable loadings. The voltage sense architecture enables tight control of the voltage applied to memory integrated circuits such as DRAMs by measuring the voltage on the DIMM as near as possible to the DRAM, communicating the information back to a system, and using the information to adjust the behavior of system components.

The voltage sense architecture enables better maintenance of the specified voltage at the DRAMs. Since a system may include many DIMMs, for example 48 or more, connecting a sense line to each DIMM would require a significant amount of board space. The illustrative voltage sense architecture leverages existing connectivity in the memory subsystem and does not require a change to the infrastructure of DIMM slots and industry standard pin-outs.

The memory apparatus 200A includes a memory module 206 comprising a circuit board 212, and a voltage measurement circuit 222 coupled to the circuit board 212 that measures voltage on the memory module 206. A register 224 is coupled to the voltage measurement circuit 222 and holds a value representing the measured voltage on the memory module 206. A bus interface 226 is coupled to the register 224.

The memory module 206 can further comprise a memory module connector 202 coupled to the circuit board 212, and a plurality of memory integrated circuits 214M mounted to the circuit board 212.

The memory module connector 202 can comprise a first plurality of pins 204 coupled to circuitry on a memory module, and a second plurality of pins 208 coupled to the bus interface 226 and coupled to power rails 210 on the memory module 206. The second plurality of pins 208 and the bus interface 226 enable monitoring of voltage on the power rails 210 from external to the memory module 206.

In some embodiments, the memory module 206 can be a dual in-line memory module (DIMM) with a plurality of dynamic random access memory (DRAM) integrated circuits 214M mounted on the DIMM. The bus interface 226 can be an inter-integrated circuit ($I^2C$) multi-master serial computer bus or a system management bus (SMBus). The memory apparatus 200A can further comprise an electrically-erasable programmable read-only memory (EEPROM) 228 that supports serial presence detect (SPD) wherein SPD memory space is allocated to include the measured memory module voltage.

Figure 2B:
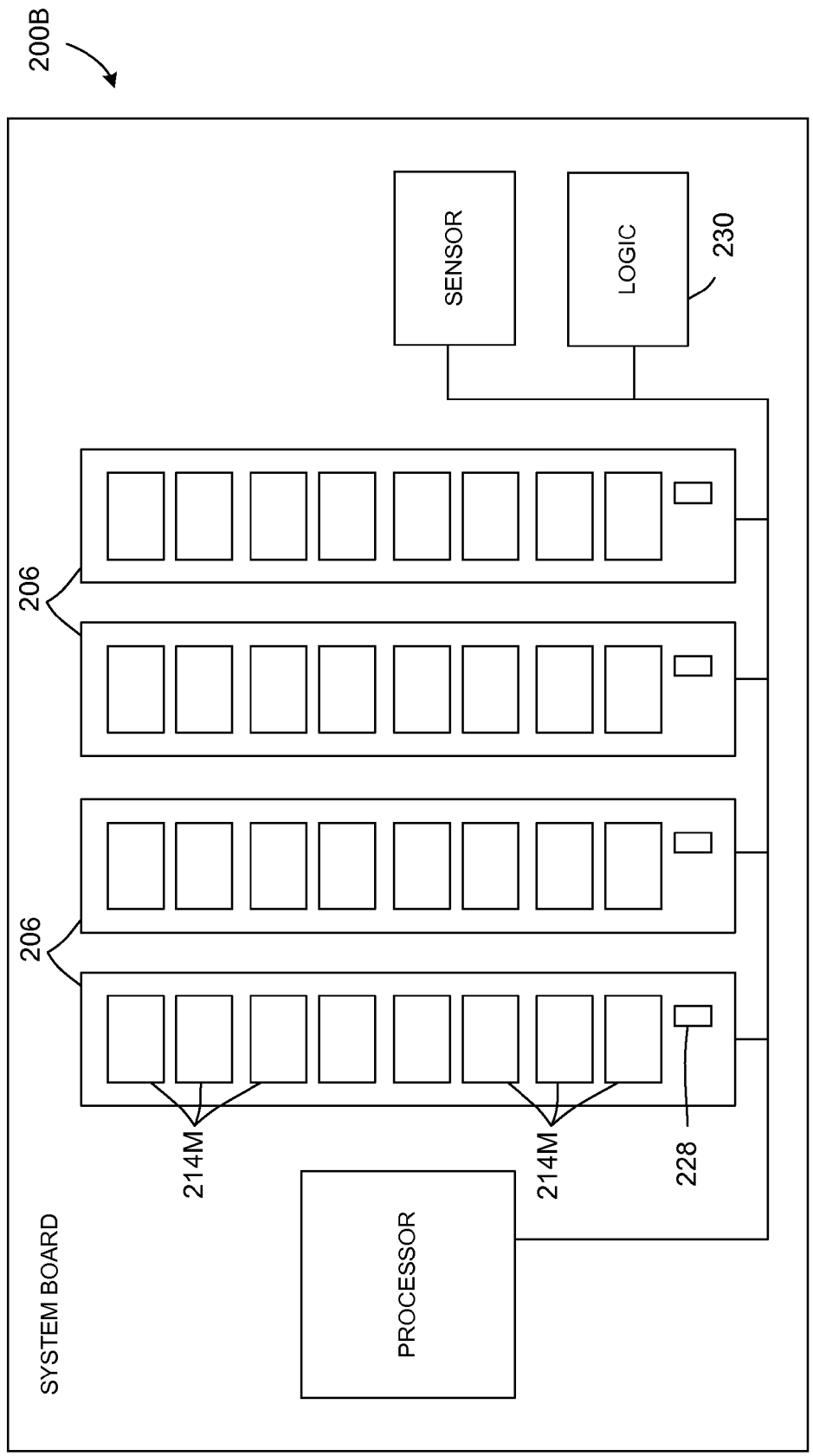

Referring to FIG. 2B in combination with FIG. 2A, a memory apparatus 200B can further comprise logic 230 that reads measured memory module voltage from the serial presence detect (SPD) memory 228 and performs dynamic power system adjustment based on the measured memory module voltage.

Figure 2C:
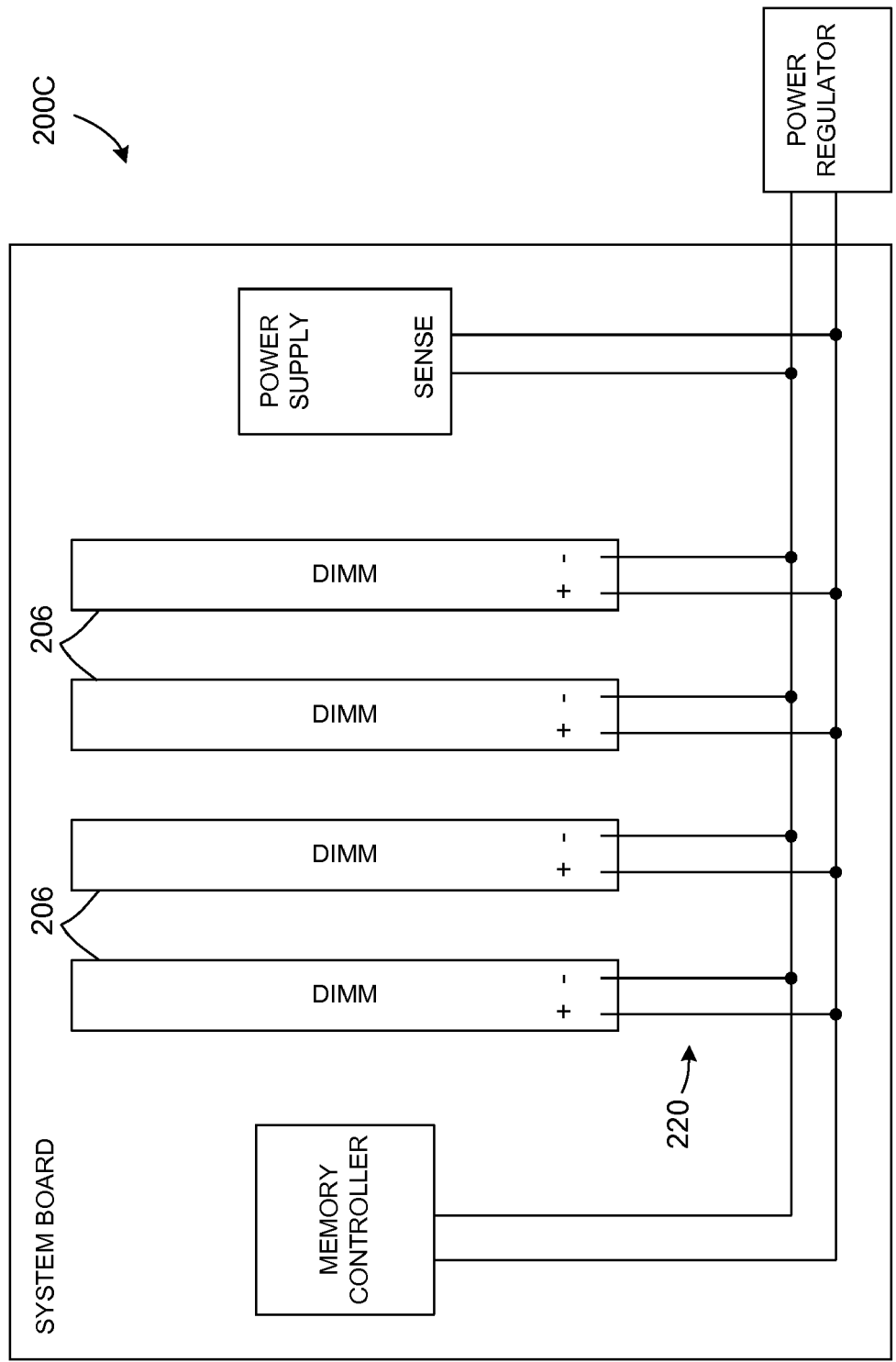

Referring to FIG. 2C in combination with FIG. 2A, a schematic block and circuit diagram depicts another embodiment of a memory apparatus 200C that enables voltage sensing in close proximity to memory integrated circuits. The memory apparatus 200C can comprise a plurality of memory modules 206 and a circuit 220 that combines power signals from the power rails 210 of the plurality of memory modules 206.

In contrast to the configurations shown in FIGS. 1A through 1F, instead of including voltage sense lines on each DIMM the voltage sense architecture configurations depicted in FIGS. 2A through 2C enable measurement of the voltage on the DIMM using a simple built-in circuit that can be integrated into one of the many parts on the DIMM printed circuit board. The built-in circuit measures the DIMM voltage and sets a register attached to a local sideband interconnect pathway, such as $I^2C$ or SMBus. By modifying the SPD specified for DIMMs standardized by JEDEC, a register space reserved in the SPD EEPROM can be allocated to write the current voltage value or a history of previous values. By using SPD space to store the voltage information, an additional $I^2C$ device address does not have to be allocated. Communication over the sideband pathway of interfaces such as $I^2C$ or SMBus allows devices on the sideband bus, such as a baseboard management controller (BMC), a power supply, a power regulation integrated circuit (IC), or a memory controller to read the current voltage from the DIMM as near in location as possible to the DRAM. Information about voltage levels can be fed back into the system for dynamic power system adjustment based on the measured voltages. The DIMMs can be polled at regular intervals to maintain the voltage as closely as possible to the desired value. Additionally, worst-case DIMMs (for example with higher capacity, higher power draw, or more intense workload) can be identified and voltage levels can be tracked more closely.

The voltage sense architecture enables voltage to be sensed on the DIMM at the DRAMs, eliminating variability in loss across the DIMM sockets and DIMM power planes that result from using DIMMs with various DRAM quantities and due to variations in power draw over time. Thus the portion of power budget tolerance consumed by this loss can be reduced and allowing for more flexibility in the remainder of the design, potentially saving cost by allowing a looser tolerance for the power supply. The voltage sense architecture can eliminate the need for additional traces to be routed on the system board, and eliminate reassignment of pins for voltage sense purposes. The voltage sense architecture can be implemented with a simple modification to the system firmware to enable use of the information generated at the DIMM, further simplifying designs since decisions about power supply behavior can be made by the system firmware or baseboard management controller (BMC), and thus can be made without a redesign of the power supply to incorporate feedback information from the DIMMs.

Referring to FIGS. 3A through 3D, flow charts illustrate one or more embodiments or aspects of a method for managing power in a computer memory, for example to meet tight tolerances across variable loadings. FIG. 3A depicts a method for managing 300 power in a computer memory comprising sensing 302 power at power rails on a memory module, and routing 304 signals indicative of the sensed power from the power rails of the memory module to a monitoring location external to the memory module.

Signals indicative of the sensed power can be routed from the center of power draw or any suitable location on the power rails on the memory module to the monitoring location external to the memory module for use in power sensing external to the memory module.

Referring to FIG. 3B, a power management method 310 can further comprise measuring 312 voltage on the memory module at a position adjacent to a memory integrated circuit mounted to the memory module, and communicating 314 the measured voltage to the location external to the memory module. Operation of system components is adjusted 316 at the location external to the memory module based on the measured voltage.

Referring to FIG. 3C, in some embodiments a power management method 320 can further comprise routing 322 signals indicative of the sensed power from the power rails of a plurality of memory modules to a monitoring location external to the memory module, and combining 324 power signals from the power rails of the plurality of memory modules.

As shown in FIG. 3D, an embodiment of a power management method 330 can comprise measuring 332 voltage on the memory module at a position adjacent to a memory integrated circuit mounted to the memory module, loading 334 a value representing the measured voltage into a register on the memory module, and enabling 336 access to the register via a bus interface on the memory module. The register can be accessed 338 from a location external to the memory module. Dynamic power system adjustment can be performed 340 based on the measured memory module voltage.

Terms "substantially", "essentially", or "approximately", that may be used herein, relate to an industry-accepted tolerance to the corresponding term. Such an industry-accepted tolerance ranges from less than one percent to twenty percent and corresponds to, but is not limited to, functionality, values, process variations, sizes, operating speeds, and the like. The term "coupled", as may be used herein, includes direct coupling and indirect coupling via another component, element, circuit, or module where, for indirect coupling, the intervening component, element, circuit, or module does not modify the information of a signal but may adjust its current level, voltage level, and/or power level. Inferred coupling, for example where one element is coupled to another element by inference, includes direct and indirect coupling between two elements in the same manner as "coupled".

The illustrative block diagrams and flow charts depict process steps or blocks in a manufacturing process. Although the particular examples illustrate specific process steps or acts, many alternative implementations are possible and commonly made by simple design choice. Acts and steps may be executed in different order from the specific description herein, based on considerations of function, purpose, conformance to standard, legacy structure, and the like.

While the present disclosure describes various embodiments, these embodiments are to be understood as illustrative and do not limit the claim scope. Many variations, modifications, additions and improvements of the described embodiments are possible. For example, those having ordinary skill in the art will readily implement the steps necessary to provide the structures and methods disclosed herein, and will understand that the process parameters, materials, and dimensions are given by way of example only. The parameters, materials, and dimensions can be varied to achieve the desired structure as well as modifications, which are within the scope of the claims. Variations and modifications of the embodiments disclosed herein may also be made while remaining within the scope of the following claims.

What is claimed is:

1. A memory apparatus comprising: a memory module connector including:
   a first plurality of pins coupled to circuitry on a memory module; and
   a second plurality of pins coupled to centers of power draw on power rails on the memory module and arranged for monitoring of the power rails from external to the memory module.

2. The apparatus according to claim 1 wherein: the second plurality of pins including voltage sense lines that route signals from the power rails on the memory module for use in power sensing external to the memory module.

3. The apparatus according to claim 1 further comprising:
a memory module including:
   the memory module connector;
   a circuit board coupled to the memory module connector; and
   a plurality of integrated circuits mounted to the circuit board and including at least one memory integrated circuit.

4. The apparatus according to claim 1 further comprising:
a plurality of memory modules, ones of the memory module plurality including the memory module connector, a circuit board coupled to the memory module connector, and a plurality of integrated circuits mounted to the circuit board; and
a circuit that combines power signals from the power rails of the plurality of memory modules.

5. The apparatus according to claim 1 further comprising:
a plurality of memory modules, ones of the memory module plurality including the memory module connector, a circuit board coupled to the memory module connector, and a plurality of integrated circuits mounted to the circuit board; and
a circuit that monitors at least one power signal from the power rails of the plurality of memory modules.

* * * * *